(12) United States Patent
Kuo et al.

(10) Patent No.: US 10,693,037 B2
(45) Date of Patent: Jun. 23, 2020

(54) LIGHT EMITTING DIODE STRUCTURE

(71) Applicant: Lextar Electronics Corporation, Hsinchu (TW)

(72) Inventors: Shiou-Yi Kuo, Kaohsiung (TW); Shih-Huan Lai, Changhua County (TW)

(73) Assignee: Lextar Electronics Corporation, Hsinchu (TW)

( * ) Notice: Subject to any disclaimer, the term of this patent is extended or adjusted under 35 U.S.C. 154(b) by 100 days.

(21) Appl. No.: 15/434,075

(22) Filed: Feb. 16, 2017

(65) Prior Publication Data

US 2017/0170361 A1   Jun. 15, 2017

Related U.S. Application Data

(62) Division of application No. 14/939,463, filed on Nov. 12, 2015, now abandoned.

(30) Foreign Application Priority Data

Dec. 3, 2014 (TW) .............................. 103142040 A
Jun. 11, 2015 (TW) .............................. 104118969 A

(51) Int. Cl.
| | |
|---|---|
| *H01L 33/10* | (2010.01) |
| *H01L 33/40* | (2010.01) |
| *H01L 33/14* | (2010.01) |
| *H01L 33/42* | (2010.01) |
| *H01L 33/20* | (2010.01) |

(52) U.S. Cl.
CPC ............ *H01L 33/10* (2013.01); *H01L 33/145* (2013.01); *H01L 33/405* (2013.01); *H01L 33/42* (2013.01); *H01L 33/20* (2013.01)

(58) Field of Classification Search
None
See application file for complete search history.

(56) References Cited

U.S. PATENT DOCUMENTS

| | | |
|---|---|---|
| 2011/0089401 A1 | 4/2011 | Hiraiwa et al. |
| 2012/0012889 A1 | 1/2012 | Okabe et al. |

(Continued)

FOREIGN PATENT DOCUMENTS

| | | |
|---|---|---|
| TW | 1292631 B | 1/2008 |
| TW | 201210074 A1 | 3/2012 |
| TW | 201246609 A1 | 11/2012 |

*Primary Examiner* — Hoang-Quan Ho
(74) *Attorney, Agent, or Firm* — CKC & Partners Co., LLC

(57) ABSTRACT

A light emitting diode structure includes a first type semiconductor layer, a second type semiconductor layer, an active layer disposed therebetween, and a reflective stacked layer. The reflective stacked layer includes a first reflective layer and a second reflective layer. The first reflective layer is disposed at a side of the second type semiconductor layer opposing the active layer. The second reflective layer is disposed at a side of the first reflective layer opposing the second type semiconductor layer, and extends along a side surface of the first reflective layer to a surface of the second type semiconductor layer. A vertical projection area of the second reflective layer on the second-type semiconductor layer is greater than that of the first reflective layer thereon. The second reflective layer has a better resistance to migration than the first reflective layer.

16 Claims, 3 Drawing Sheets

(56) References Cited

U.S. PATENT DOCUMENTS

| | | | |
|---|---|---|---|
| 2012/0049232 A1* | 3/2012 | Okabe | H01L 33/38 |
| | | | 257/98 |
| 2012/0217531 A1* | 8/2012 | Katsuno | H01L 33/40 |
| | | | 257/99 |
| 2014/0034981 A1 | 2/2014 | Hung et al. | |
| 2014/0231849 A1 | 8/2014 | Song et al. | |
| 2014/0252319 A1 | 9/2014 | Li | |
| 2016/0197239 A1 | 7/2016 | Kuo et al. | |
| 2017/0025571 A1* | 1/2017 | Kim | H01L 33/145 |

\* cited by examiner

LIGHT EMITTING DIODE STRUCTURE

RELATED APPLICATIONS

The present application is a Divisional Application of the U.S. application Ser. No. 14/939,463, filed Nov. 12, 2015, which claims priority to Taiwanese Application Serial Number 103142040, filed Dec. 3, 2014 and 104118969, filed Jun. 11, 2015, all of which are herein incorporated by reference.

BACKGROUND

Field of Invention

The present invention relates to a light emitting diode structure.

Description of Related Art

In recent years, with the merits of high-directivity, energy saving, etc., light-emitting diodes (LEDs) have been applied in various illumination devices and display devices. A complete light emitting diode should be accompanied with a suitable packaging structure for providing light output with desired intensity and uniformity. Therefore, in the LED industry, in addition to the disposition of the light-emitting layer itself, such as semiconductor layers in the light emitting diode, the packaging structure accompanying the light emitting diode also plays a role.

Generally, for increasing light output intensity, in the packaging structure of the light emitting diode, a reflective layer is often disposed for reflecting the light emitted by the light emitting diode. Therefore, the light emitting diode can emit light in one single direction. This packaging facilitates the application of LED in various illumination devices and display devices. However, the packaging structure with the reflective layer may be affected by an ambient vapor, temperature, acid, etc., thus causing the problems such as migration, peeling, and corrosion.

SUMMARY

The invention provides a light emitting diode structure. Two reflective layers formed from different materials are collectively used to form a reflective surface of the light emitting diode structure, thereby increasing the area of the reflective surface, further protecting the reflective layers from being affected by an ambient vapor, temperature, acid, etc. without lowering light output intensity.

One aspect of this invention is to provide a light emitting diode structure includes a first type semiconductor layer, an active layer, a second type semiconductor layer, and a reflective stacked layer. The active layer is disposed between the first type semiconductor layer and the second type semiconductor layer. The reflective stacked layer includes a first reflective layer and a second reflective layer. The first reflective layer is disposed at a side of the second type semiconductor layer opposing the active layer. The second reflective layer is disposed at a side of the first reflective layer opposing to the second type semiconductor layer, and extends along a side surface of the first reflective layer to a surface of the second type semiconductor layer. The first reflective layer has a first surface proximate to the second type semiconductor layer, and the second reflective layer has a second surface proximate to the second type semiconductor layer. A vertical projection area of the second reflective layer on the second-type semiconductor layer is greater than that of the first reflective layer on the second-type semiconductor layer. The second reflective layer has a better resistance to migration than the first reflective layer.

In one or more embodiments of the present invention, a reflectance of the first reflective layer is greater than a reflectance of the second reflective layer.

In one or more embodiments of the present invention, the reflectance of the first reflective layer is in a range substantially from 90% to 100%, and the reflectance of the second reflective layer is substantially greater than 80% but smaller than the reflectance of the first reflective layer.

In one or more embodiments of the present invention, the first surface and the second surface form a reflective surface of the reflective stacked layer.

In one or more embodiments of the present invention, the first surface substantially occupies 80% to 99% of an area of the reflective surface, and the second surface substantially occupies 1% to 20% of the area of the reflective surface.

In one or more embodiments of the present invention, the first surface substantially occupies 90% to 95% of an area of the reflective surface, and the second surface substantially occupies 5% to 10% of the area of the reflective surface.

In one or more embodiments of the present invention, the reflective stacked layer comprises a first blocking layer disposed between the first reflective layer and the second reflective layer.

In one or more embodiments of the present invention, the reflective stacked layer includes a second blocking layer disposed at a side of the second reflective layer opposing the first reflective layer.

In one or more embodiments of the present invention, the light emitting diode structure further includes a current blocking layer, wherein the second reflective layer further includes a recess disposed at a side of the second reflective layer facing the second type semiconductor layer, and the current blocking layer is disposed in the recess and adjoins the second type semiconductor layer.

In one or more embodiments of the present invention, a projection of the first reflective layer on the second type semiconductor layer is located in a projection of the second reflective layer on the second type semiconductor layer.

In one or more embodiments of the present invention, the first reflective layer is formed from silver, and the second reflective layer is formed from aluminum, rhodium, a silver alloy, or a combination thereof.

In one or more embodiments of the present invention, the first reflective layer is formed from silver or a silver alloy, and the second reflective layer is formed from aluminum, rhodium, or a combination thereof.

In one or more embodiments of the present invention, the light emitting diode structure further includes a transparent conductive layer disposed between the second type semiconductor layer and the reflective stacked layer.

In one or more embodiments of the present invention, the reflective stacked layer further includes a transparent conductive layer disposed between the first reflective layer and the second type semiconductor layer, and a surface of the transparent conductive layer facing the second type semiconductor layer and the second surface are coplanar to form a reflective surface of the reflective stacked layer.

In one or more embodiments of the present invention, a reflectance of the first reflective layer is greater than a reflectance of the second reflective layer.

In one or more embodiments of the present invention, the reflectance of the first reflective layer is in a range substantially from 90% to 100%, and the reflectance of the second reflective layer is substantially greater than 80% but smaller than the reflectance of the first reflective layer.

In one or more embodiments of the present invention, the surface of the transparent conductive layer facing the second type semiconductor layer substantially occupies 80% to 99% of an area of the reflective surface, and the second surface substantially occupies 1% to 20% of the area of the reflective surface.

In one or more embodiments of the present invention, the reflective stacked layer includes a first blocking layer disposed between the first reflective layer and the second reflective layer.

In one or more embodiments of the present invention, the reflective stacked layer includes a second blocking layer disposed at a side of the second reflective layer opposing the first reflective layer.

In one or more embodiments of the present invention, the light emitting diode structure further includes a current blocking layer, wherein the second reflective layer further includes a recess disposed at a side of the second reflective layer facing the second type semiconductor layer, and the current blocking layer is disposed in the recess and adjoins the second type semiconductor layer.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

It will be understood that when an element is referred to as being "on" another element, it can be directly on the other element or intervening elements may be present therebetween. In contrast, when an element is referred to as being "directly on" another element, there are no intervening elements present.

Figure 1:
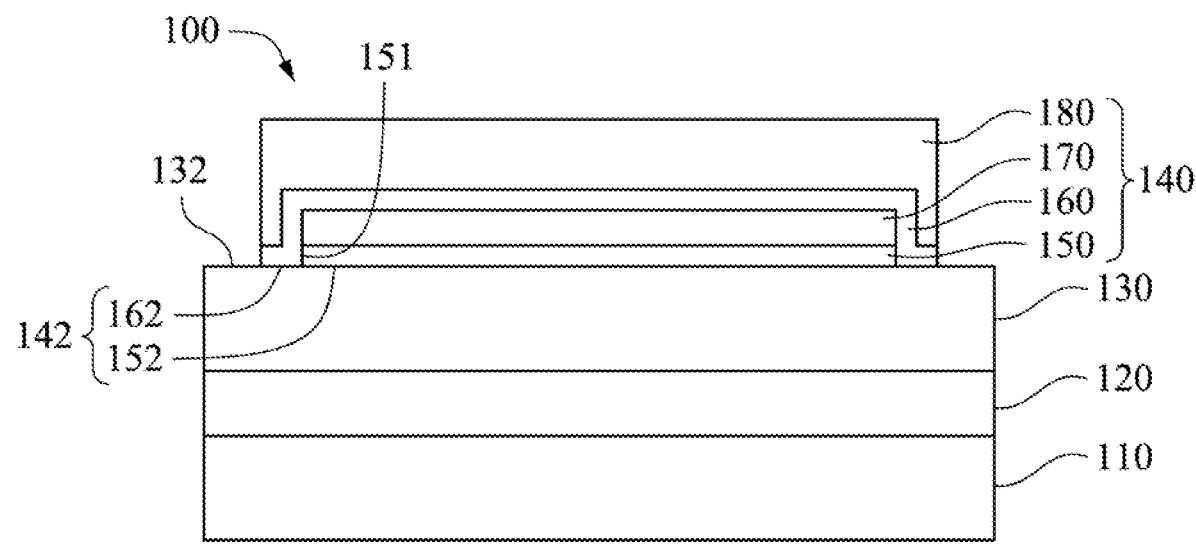
FIG. 1 is a schematic cross-sectional view of a light emitting diode structure according to one embodiment of this invention.

FIG. 1 is a schematic cross-sectional view of a light emitting diode structure 100 according to one embodiment of this invention. The light emitting diode structure 100 includes a first type semiconductor layer 110, an active layer 120, a second type semiconductor layer 130, and a reflective stacked layer 140. The active layer 120 is disposed between the first type semiconductor layer 110 and the second type semiconductor layer 130, such that the first type semiconductor layer 110 and the second type semiconductor layer 130 can be operated to emit light. The reflective stacked layer 140 includes a first reflective layer 150, a second reflective layer 160, a first blocking layer 170, and a second blocking layer 180. The first reflective layer 150 is disposed at a side of the second type semiconductor layer 130 opposing the active layer 120. The second reflective layer 160 is disposed at a side of the first reflective layer 150 opposing the second type semiconductor layer 130 and extends along a side surface 151 of the first reflective layer 150 to a surface 132 of the second type semiconductor layer 130. The first blocking layer 170 is disposed between the first reflective layer 150 and the second reflective layer 160. The second blocking layer 180 is disposed at a side of the second reflective layer 160 opposing the first reflective layer 150.

In one or more embodiments of the present invention, a vertical projection area of the second reflective layer 160 on the second type semiconductor layer 130 is greater than that of the first reflective layer 150 on the second type semiconductor layer 130. To be specific, a projection of the first reflective layer 150 on the second type semiconductor layer 130 is located in a projection of the second reflective layer 160 on the second type semiconductor layer 130. Therefore, the second reflective layer 160 covers the first reflective layer 150 and prevents the first reflective layer 150 from being exposed.

Furthermore, the first reflective layer 150 has a first surface 152 proximate to the second type semiconductor layer 130, and the second reflective layer 160 has a second surface 162 proximate to the second type semiconductor layer 130. Herein, the first surface 152 is referred to as a contact surface between the first reflective layer 150 and the second type semiconductor layer 130, and the second surface 162 is referred to as a contact surface between the second reflective layer 160 and the second type semiconductor layer 130. The second surface 162 is disposed at a periphery of the first surface 152.

As a result, the reflective stacked layer 140 is disposed on the second type semiconductor layer 130 with a sequence of the first reflective layer 150, the first blocking layer 170, the second reflective layer 160 and the second blocking layer 180 stacked on the second type semiconductor layer 130, and the second reflective layer 160 covers the first reflective layer 150 and prevents the first reflective layer 150 from being exposed.

In one or more embodiments of the present invention, in the configuration of the reflective stacked layer 140, a reflectance of the first reflective layer 150 is greater than that of the second reflective layer 160, and the second reflective layer 160 has a better stability than the first reflective layer 150. In other words, the second reflective layer 160 has a better resistance to migration than the first reflective layer 150, and thereby the second reflective layer 160 suffers less migration, peeling, corrosion, etc. than the first reflective layer 150.

Herein, only four materials, silver, aluminum, silver alloy, and rhodium, are used as examples for explanation, but they do not intend to limit the scope of the present invention. The reflectance of these four materials is descending in the sequence of silver (about 95%), silver alloy (about 90%), aluminum (about 85%), and rhodium (about 80%). Resistances to migration of these four materials, ranging from bad to good are, silver, aluminum, silver alloy, and rhodium. In the configuration of the first reflective layer 150 and the second reflective layer 160, appropriate materials are chosen for enhancing the reflectance and improving the resistance to migration of a combination of the first reflective layer 150 and the second reflective layer 160. Ideally, for achieving the light output intensity effectively, in the selection of the materials of the reflective layers, the reflectance of the first reflective layer 150 is in a range substantially from 90% to 100%, and the reflectance of the second reflective layer 160 is substantially greater than 80% but smaller than the reflectance of the first reflective layer 150.

For example, in one embodiment, the first reflective layer 150 can be formed from silver, and the second reflective layer 160 can be formed from aluminum, rhodium, silver alloy, or a combination thereof. In another embodiment, the first reflective layer 150 can be formed from aluminum, and the second reflective layer 160 is formed from rhodium. In this way, the reflectance and the resistance to migration of the first reflective layer 150 and those of the second reflective layer 160 can be taken into consideration. Of course, the materials listed herein do not intend to limit the scope of the present invention, and any material with high reflectance and good resistance to migration can also be applicable to the first reflective layer 150 and the second reflective layer 160.

In one or more embodiments of the present invention, the first blocking layer 170 and the second blocking layer 180 can be formed from materials having good stability, adhesion, and other properties. The first blocking layer 170 and the second blocking layer 180 are configured to prevent the migration, peeling, corrosion, etc. of metal layers or reflective layers. However, these materials may have low reflectance, which may be substantially lower than 60%, for example. The first blocking layer 170 and the second blocking layer 180 can be formed from titanium, platinum, gold, nickel, tungsten, titanium tungsten alloy, or a combination thereof, for example.

In one or more embodiments of the present invention, the second reflective layer 160 extends along the side surface 151 of the first reflective layer 150 to the surface 132 of the second type semiconductor layer 130, thereby preventing either the first blocking layer 170 or the second blocking layer 180 from directly adjoining the second type semiconductor layer 130. That is, neither the first blocking layer 170 nor the second blocking layer 180 constitutes a portion of the reflective surface 142 of the reflective stacked layer 140 in contact with the second type semiconductor layer 130. To be specific, the first blocking layer 170 is utilized for preventing the first reflective layer 150 from peeling off. The second reflective layer 160 covers the first blocking layer 170 and constitutes a portion of the reflective surface 142 for increasing the area with the reflective function. The second blocking layer 180 is utilized for protecting both the first reflective layer 150 and the second reflective layer 160 from peeling off. The configuration ensures the protection to the first reflective layer 150 and the second refection layer 160 against migration, corrosion, etc. without decreasing the reflective function of the reflective surface 142, and thereby enhances the reliability of the first reflective layer 150 and the second reflective layer 160.

In one or more embodiments of the present invention, the first surface 152 and the second surface 162 together form the reflective surface 142 of the reflective stacked layer 140. Since the first reflective layer 150 and the second reflective layer 160 are both formed from reflective materials, the reflective surface has a high reflectance, and therefore can reflect the light emitted from the active layer 120.

In one or more embodiments of the present invention, the first type semiconductor layer 110 can be an n-type semiconductor layer, and the second type semiconductor layer 130 can be a p-type semiconductor layer. Instead, the first type semiconductor layer 110 can also be a p-type semiconductor layer, and the second type semiconductor layer 130 can be an n-type semiconductor layer.

Figure 2:
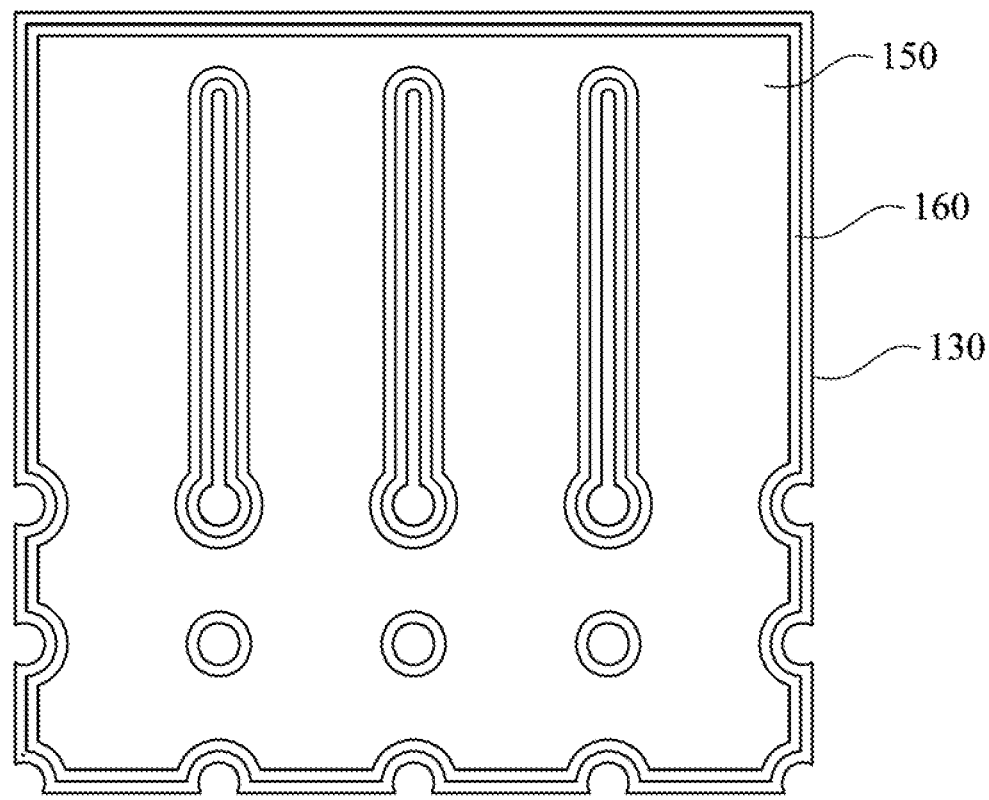
FIG. 2 is a schematic view showing areas of the light emitting diode structure of FIG. 1.

Reference is now made to both FIG. 1 and FIG. 2. FIG. 2 is a schematic view showing areas of the light emitting diode structure 100 of FIG. 1. FIG. 2 depicts a distribution of projections of the first reflective layer 150 and the second reflective layer 160 on the surface 132 of the second type semiconductor layer 130 in the light emitting diode structure 100. The projection area of the first reflective layer 150 on the second type semiconductor layer 130 is substantially equal to an area of the first surface 152. The projection area of the second reflective layer 160 on the second type semiconductor layer 130 is substantially equivalent to a sum of areas of the first surface 152 and the second surface 162. As previous illustration, the projection area of the second reflective layer 160 on the second type semiconductor layer 130 is greater than the projection area of the first reflective layer 150 on the second type semiconductor layer 130. For example, in an embodiment, the first surface 152 substantially occupies 80% to 99% of an area of the reflective surface 142, and the second surface 162 substantially occupies 1% to 20% of the area of the reflective surface 142. Moreover, the first surface 152 may substantially occupy 90% to 95% of the area of the reflective surface 142, and the second surface 162 substantially occupies 5% to 10% of the area of the reflective surface 142.

Herein, two sets of experimental results are shown for reference. The semiconductor layers in the first set of experimental results and the second set of experimental results are obtained from different batches and thus should not be discussed together. Also, to compare the advantages or disadvantages between the sets of experimental results, another two light emitting diode structures with the semiconductor layers formed at the same batch with the semiconductor layers in the two sets of experimental results are also provided as reference structures, and each of the reference structures has no second reflective layer 160 but has a second blocking layer 180 covering the second type semiconductor layer 130 directly. In other words, in the configuration of each reference structure, the second blocking layer 180 constitutes a portion of the reflective surface 142 of the reflective stacked layer 140 adjoining the second type semiconductor layer 130.

The first set of experimental results shows that the light emitting diode structure designed according to the configuration of FIG. 1 has a light output intensity value of about 425 microwatts, while the corresponding reference structure has a light output intensity value of only 390 microwatts. The second set of experimental results shows that the light emitting diode structure designed according to the configuration of FIG. 1 has a light output intensity value of about 450 microwatts, while the corresponding reference structure has a light output intensity value of only 410 microwatts. As a result, it can be known that, with the configuration of FIG. 1, the light output intensity of the light emitting diode structure can be enhanced.

Consequently, with the configuration of the second reflective layer 160, an area of the reflective surface 142 can be increased, thereby enhancing the light output intensity of the light emitting diode structure 100.

Figure 3:
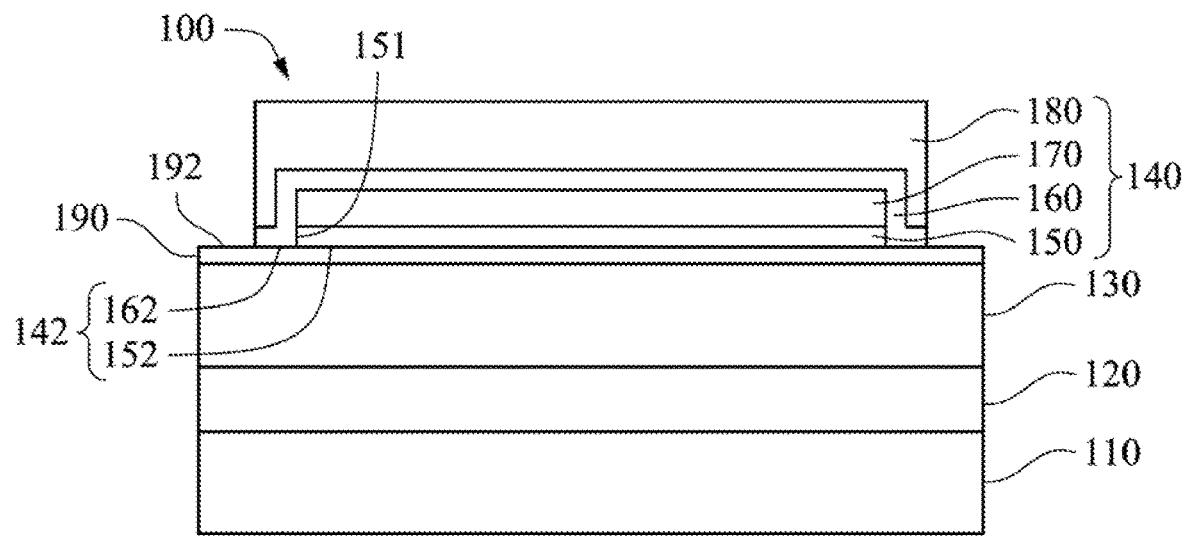
FIG. 3 is a schematic cross-sectional view of a light emitting diode structure according to another embodiment of this invention.

FIG. 3 is a schematic cross-sectional view of a light emitting diode structure 100 according to another embodiment of this invention. The present embodiment is similar to the embodiment of FIG. 1, but is different therefrom in that the light emitting diode structure 100 of the present embodiment includes a transparent conductive layer 190. The transparent conductive layer 190 is disposed between the second type semiconductor layer 130 and the reflective stacked layer 140. Herein, the second reflective layer 160 extends along a side surface 151 of the first reflective layer 150 to the transparent conductive layer 190 and the second type semiconductor layer 130, and the second reflective layer 160 is in contact with the surface 192 of the transparent conductive layer 190. The transparent conductive layer 190 has the properties of low resistivity and high transmittance, and can be formed from indium tin oxide. Therefore, the transparent conductive layer 190 can improve the current distribution of the light emitting diode structure 100 without influencing the light output effect.

Figure 4:
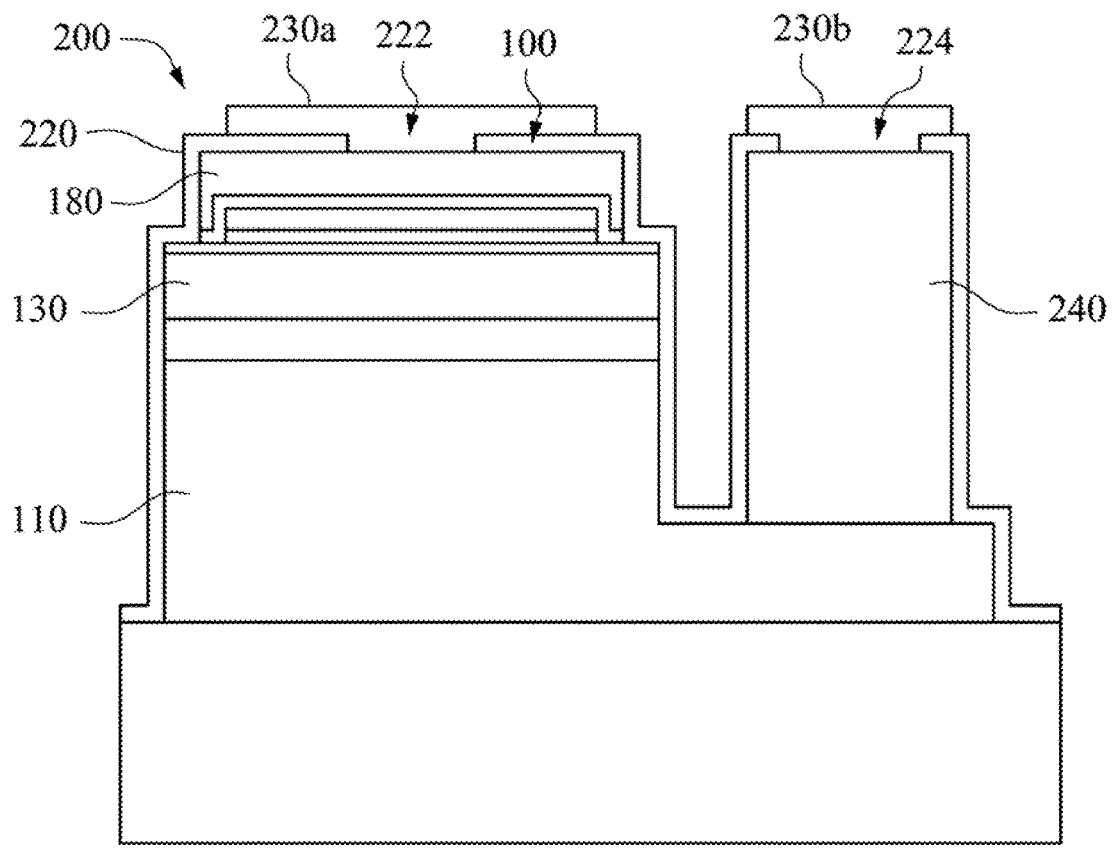
FIG. 4 is a schematic cross-sectional view of a light emitting diode structure according to another embodiment of this invention.

The light emitting diode structures 100 of the embodiments shown in FIG. 1 and FIG. 3 are applicable to a partial structure of a flip chip light emitting diode device 200. Referring to FIG. 4, FIG. 4 shows a configuration of the light emitting diode structure 100 of FIG. 3 applied on the flip chip light emitting diode device 200. Herein, the flip chip light emitting diode device 200 further includes a passivation layer 220, metal layers 230a and 230b, and a metal column 240 in addition to the light emitting diode structure 100. The metal column 240 is disposed at a side of the first type semiconductor layer 110 facing the second type semiconductor layer 130. The passivation layer 220 covers the light emitting diode structure 100 and the metal column 240 for stopping invasion of vapor and providing isolation. The passivation layer 220 has an opening 222 configured to expose the second blocking layer 180 and an opening 224 configured to expose the metal column 240. The metal layers 230a and 230b are disposed at a side of the passivation layer 220 opposing the first type semiconductor layer 110, in which the metal layer 230a is in contact with the second blocking layer 180 through the opening 222, and the metal layer 230b is electrically connected with the first type semiconductor layer 110 through the metal column 240 filling the opening 224.

Thus, by connecting the metal layers 230a and 230b, the flip chip light emitting diode device 200 can operate and generate light. Also, due to the configuration of the first reflective layer 150 and the second reflective layer 160 inside the flip chip light emitting diode device 200, the reliability of the reflective stacked layer 140 can be improved and the light output intensity can be enhanced.

Figure 5:
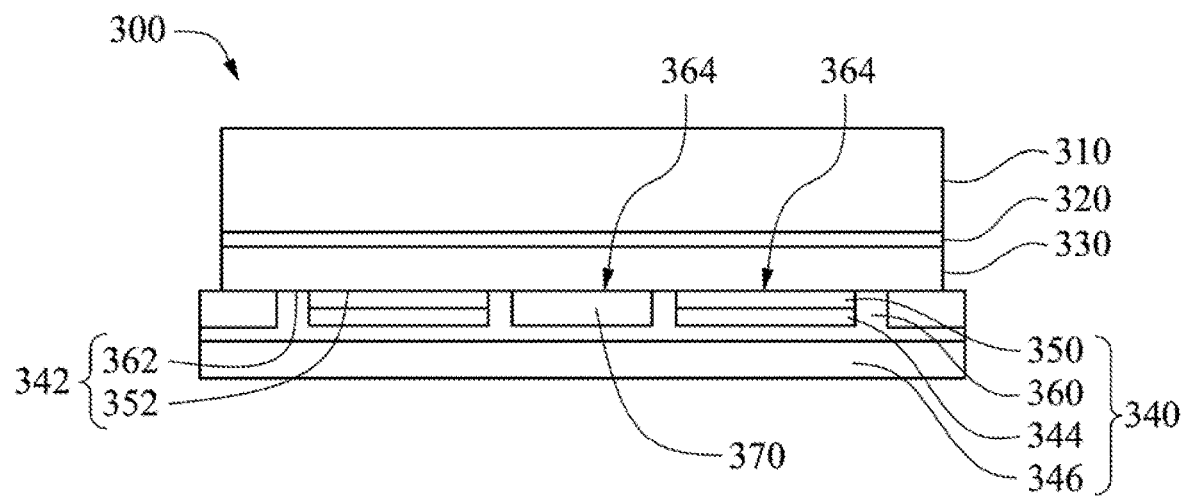
FIG. 5 is a schematic cross-sectional view of a light emitting diode structure according to another embodiment of this invention.

FIG. 5 is a schematic cross-sectional view of a light emitting diode structure 300 according to another embodiment of this invention. The present embodiment is similar to the embodiment of FIG. 1, but is different therefrom in that a vertical light emitting diode structure is adopted in the present embodiment. To be specific, the difference between the present embodiment and the embodiment of FIG. 1 lies in that the light emitting diode structure 300 includes a configuration of a recess 364.

As illustrated above, in one or more embodiments of the present invention, the light emitting diode structure 300 includes a first type semiconductor layer 310, an active layer 320, a second type semiconductor layer 330, and a reflective stacked layer 340. The active layer 320 is disposed between the first type semiconductor layer 310 and the second type semiconductor layer 330. The reflective stacked layer 340 includes a first reflective layer 350, a second reflective layer 360, a first blocking layer 344, and a second blocking layer 346. The first reflective layer 350 is disposed at a side of the second type semiconductor layer 330 opposing the active layer 320. The second reflective layer 360 is disposed at a side of the first reflective layer 350 opposing the second type semiconductor layer 330. The first blocking layer 344 is disposed between the first reflective layer 350 and the second reflective layer 360. The second blocking layer 346 is disposed at a side of the second reflective layer 360 opposing the first reflective layer 350.

It is noted that, in the present embodiment, the second reflective layer 360 may include a recess 364. The recess 364 is disposed at a side of the second reflective layer 360 facing the second type semiconductor layer 330, and the first reflective layer 350 and the first blocking layer 344 are disposed in the recess 364.

Herein, since the first reflective layer 350, the second reflective layer 360, the first blocking layer 344, and the second blocking layer 346 are similar to the elements in the embodiment of FIG. 1, the details thereof are not repeated herein.

In one or more embodiments of the present invention, the first reflective layer 350 has a first surface 352 proximate to the second type semiconductor layer 330, and the second reflective layer 360 has a second surface 362 proximate to the second type semiconductor layer 330. The first surface 352 and the second surface 362 are coplanar to form a reflective surface 342 of the reflective stacked layer 340. Herein, the first surface 352 is referred to as a contact surface between the first reflective layer 350 and the second type semiconductor layer 330, and the second surface 362 is referred to as a contact surface between the second reflective layer 360 and the second type semiconductor layer 330.

In one or more embodiments of the present invention, the light emitting diode structure 300 further includes a current blocking layer 370, and the number of the recess 364 can be plural, and the current blocking layer 370 can be disposed in the recess 364 in which none of the first reflective layer 350 and the first blocking layer 344 are disposed, and the current blocking layer 370 adjoins the second type semiconductor layer 330 for improving the current distribution of the light emitting diode structure 300. Certainly, the recess 364 with the first reflective layer 350 and the first blocking layer 344 disposed therein may be different from the recess 364 with the current blocking layer 370 disposed therein in size, depth or other configuration features.

As described the embodiment of FIG. 1, with the configuration of the second reflective layer 360, neither the first blocking layer 344 nor the second blocking layer 346 constitutes a portion of the reflective surface 342. Consequently, the first reflective layer 350 and the second reflective layer 360 are protected from having problems such as migration, peeling and corrosion, and the light output intensity can be increased.

Figure 6:
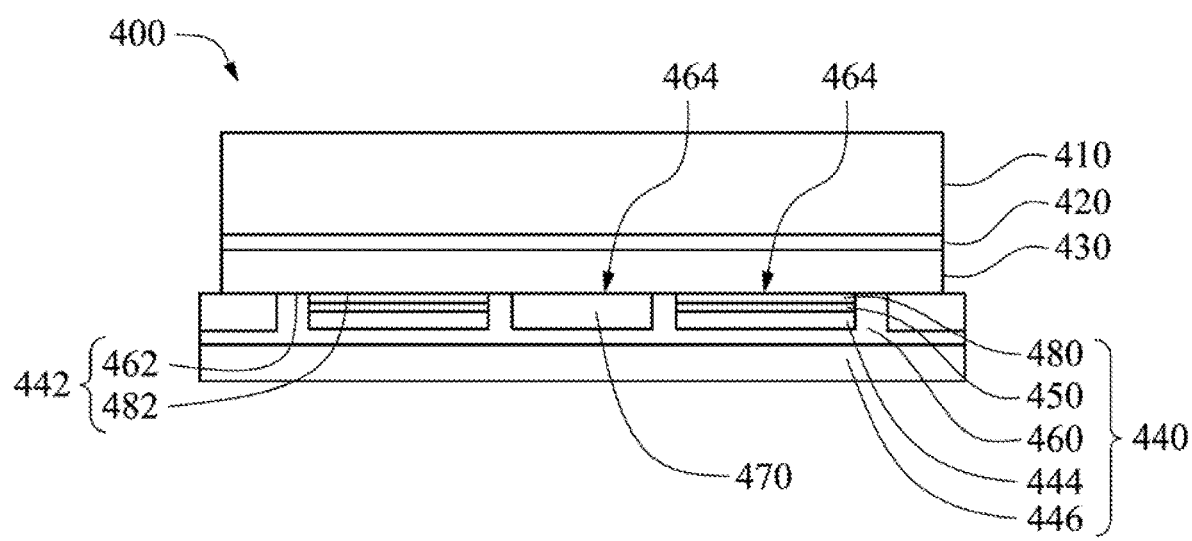
FIG. 6 is a schematic cross-sectional view of a light emitting diode structure according to another embodiment of this invention.

FIG. 6 is a schematic cross-sectional view of a light emitting diode structure 400 according to another embodiment of this invention. The present embodiment is similar to the embodiment of FIG. 5 but is different therefrom in that the reflective stacked layer 440 of the light emitting diode structure 400 of the present embodiment further includes a transparent conductive layer 480.

As described above, the light emitting diode structure 400 includes a first type semiconductor layer 410, an active layer 420, a second type semiconductor layer 430, and a reflective stacked layer 440. The active layer 420 is disposed between the first type semiconductor layer 410 and the second type semiconductor layer 430.

Herein, different from the embodiment of FIG. 5, the reflective stacked layer 440 includes a first reflective layer 450, a second reflective layer 460, a first blocking layer 444, a second blocking layer 446, and a transparent conductive layer 480. The second reflective layer 460 may include a recess 464 disposed at a side of the second reflective layer 460 facing the second type semiconductor layer 430. In the present embodiment, the first reflective layer 450, the first blocking layer 444, and the transparent conductive layer 480 are all disposed in the recess 464.

To be specific, the transparent conductive layer 480 is disposed between the first reflective layer 450 and the second type semiconductor layer 430. The second reflective layer 460 has a second surface 465 proximate to the second type semiconductor layer 430. A surface 482 of the transparent conductive layer 480 facing the second type semiconductor layer 430 is coplanar with the second surface 462 to form a reflective surface 442 of the reflective stacked layer 440. Herein, the surface 482 is referred to as a contact surface between the transparent conductive layer 480 and the second type semiconductor layer 430, and the second surface 462 is referred to as a contact surface between the second reflective layer 460 and the second type semiconductor layer 430.

In one or more embodiments of the present invention, the surface 482 of the transparent conductive layer 480 facing the second type semiconductor layer 430 substantially occupies 80% to 99% of an area of the reflective surface 442, and the second surface 462 substantially occupies 1% to 20% of the area of the reflective surface 442. Furthermore, the surface 482 of the transparent conductive layer 480 facing the second type semiconductor layer 430 substantially occupies 90% to 95% of an area of the reflective surface 442, and the second surface 462 substantially occupies 5% to 10% of the area of the reflective surface 442.

As shown in FIG. 6, the light emitting diode structure 400 further includes a current blocking layer 470, and the number of the recess 464 can be plural, and the current blocking layer 470 can be disposed in the recess 464 in which, none of the first reflective layer 450, the first blocking layer 444, and the transparent conductive layer 480 are disposed, and the current blocking layer 470 adjoins the second type semiconductor layer 430 for improving the current distribution of the light emitting diode structure 300. Certainly, the recess 464 with the first reflective layer 450, the first blocking layer 444, and the transparent conductive layer 480 disposed therein may be different from the recess 464 with the current blocking layer 470 disposed therein in size, depth or other configuration features.

Among the aforementioned light emitting diode structures, the first blocking layer, the second blocking layer, the transparent conductive layer, the current blocking layer are not necessary configuration, and can be optionally disposed based on the actual package structures. Certainly, preferably, the first blocking layer and the second blocking layer can be disposed for achieving better protection.

The invention provides a light emitting diode structure. Two reflective layers formed from different materials are collectively used to form a reflective surface of the light emitting diode structure, thereby increasing the area of the reflective surface, further protecting the reflective layers from being affected by an ambient vapor, temperature, acid, etc. without lowering the intensity of light output.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention fall within the scope of the following claims.

What is claimed is:

1. A light emitting diode structure, comprising:
   a first type semiconductor layer;
   an active layer;
   a second type semiconductor layer, wherein the active layer is disposed between the first type semiconductor layer and the second type semiconductor layer;
   a reflective stacked layer, comprising:
      a pair of first reflective layers disposed at a side of the second type semiconductor layer opposing the active layer;
      a second reflective layer which is disposed at a side of each of the first reflective layers opposing the second type semiconductor layer, and extends along lateral surfaces of each of the first reflective layers to a surface of the second type semiconductor layer, wherein the second reflective layer has a better resistance to migration than the first reflective layers;
      a pair of first blocking layers disposed between the first reflective layers and the second reflective layer; and
      a second blocking layer disposed at a side of the second reflective layer opposing the first reflective layers; and
   a current blocking layer disposed between the first reflective layers, wherein the second reflective layer further comprises a first recess disposed at a side of the second reflective layer facing the second type semiconductor layer, and the current blocking layer is disposed in the first recess.

2. The light emitting diode structure of claim 1, wherein a reflectance of the first reflective layers is greater than a reflectance of the second reflective layer.

3. The light emitting diode structure of claim 2, wherein the reflectance of the first reflective layers is in a range substantially from 90% to 100%, and the reflectance of the second reflective layer is substantially greater than 80% but smaller than the reflectance of the first reflective layers.

4. The light emitting diode structure of claim 1, wherein the second reflective layer further comprises second recesses disposed at the side of the second reflective layer facing the second type semiconductor layer, and the first reflective layers are disposed in the second recesses respectively.

5. The light emitting diode structure of claim 4, wherein each second recess is wider than the first recess.

6. The light emitting diode structure of claim 1, wherein the reflective stacked layer further comprises a pair of transparent conductive layers, each transparent conductive layer is disposed between a corresponding one of the first reflective layers and the second type semiconductor layer.

7. The light emitting diode structure of claim 6, wherein the second reflective layer has a second surface proximate to the second type semiconductor layer, and the second surface and a surface of each transparent conductive layer facing the second type semiconductor layer are coplanar to form a reflective surface of the reflective stacked layer.

8. The light emitting diode structure of claim 7, wherein the surface of each transparent conductive layer facing the second type semiconductor layer substantially occupies 80% to 99% of an area of the reflective surface, and the second surface substantially occupies 1% to 20% of the area of the reflective surface.

9. The light emitting diode structure of claim 6, wherein the second reflective layer further comprises a pair of second recesses disposed at the side of the second reflective layer facing the second type semiconductor layer, and each first reflective layer and each transparent conductive layer are disposed in each second recess.

10. The light emitting diode structure of claim 1, wherein the second reflective layer further comprises a pair of second recesses disposed at the side of the second reflective layer facing the second type semiconductor layer, and each first reflective layer and each first blocking layer are disposed in each second recess.

11. The light emitting diode structure of claim 1, wherein the current blocking layer adjoins the second type semiconductor layer.

12. The light emitting diode structure of claim 1, wherein each first reflective layer is formed from silver, and the second reflective layer is formed from aluminum, rhodium, a silver alloy, or a combination thereof.

13. The light emitting diode structure of claim 1, wherein each first reflective layer is formed from silver or a silver alloy, and the second reflective layer is formed from aluminum, rhodium, or a combination thereof.

14. The light emitting diode structure of claim 1, wherein the current blocking layer and the second type semiconductor layer forms an interface that is coplanar to a contact surface between each first reflective layer and the second type semiconductor layer.

15. A light emitting diode structure, comprising:
a first type semiconductor layer;
an active layer;
a second type semiconductor layer, wherein the active layer is disposed between the first type semiconductor layer and the second type semiconductor layer;
a reflective stacked layer, comprising:
  a first reflective layer disposed at a side of the second type semiconductor layer opposing the active layer;
  a second reflective layer which is disposed at a side of the first reflective layer opposing the second type semiconductor layer, and extends along lateral surfaces of the first reflective layer to a surface of the second type semiconductor layer, wherein the second reflective layer has a better resistance to migration than the first reflective layers;
  a pair of first blocking layers disposed between the first reflective layers and the second reflective layer; and
  a second blocking layer disposed at a side of the second reflective layer opposing the first reflective layers; and
a current blocking layer, wherein the second reflective layer further comprises a first recess and a pair of second recesses both disposed at a side of the second reflective layer facing the second type semiconductor layer, the first recess is set between the pair of second recesses in a lateral direction, the current blocking layer is disposed in the first recess, and the first reflective layer is disposed in the second recess.

16. A light emitting diode structure, comprising:
a first type semiconductor layer;
an active layer;
a second type semiconductor layer, wherein the active layer is disposed between the first type semiconductor layer and the second type semiconductor layer;
a reflective stacked layer, comprising:
  a first reflective layer having two parts disposed at a side of the second type semiconductor layer opposing the active layer; and
  a second reflective layer which is disposed at a side of each of the two parts of the first reflective layer opposing the second type semiconductor layer, and extends along lateral surfaces of each of the two parts of the first reflective layer to a surface of the second type semiconductor layer, wherein the second reflective layer has a better resistance to migration than the first reflective layer; and
  a pair of first blocking layers disposed between the first reflective layers and the second reflective layer; and
  a second blocking layer disposed at a side of the second reflective layer opposing the first reflective layers; and
a current blocking layer disposed between the two parts of the first reflective layer, wherein the second reflective layer further comprises a first recess disposed at a side of the second reflective layer facing the second type semiconductor layer, and the current blocking layer is disposed in the first recess.

* * * * *